United States Patent
Tsai et al.

(10) Patent No.: US 12,520,548 B2
(45) Date of Patent: Jan. 6, 2026

(54) SEMICONDUCTOR SUBSTRATE WITH BALANCED STRESS

(71) Applicant: Industrial Technology Research Institute, Hsinchu (TW)

(72) Inventors: Chia-Lung Tsai, Kaohsiung (TW); Hsueh-Hsing Liu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 541 days.

(21) Appl. No.: 17/994,403

(22) Filed: Nov. 28, 2022

(65) Prior Publication Data

US 2023/0132155 A1   Apr. 27, 2023

Related U.S. Application Data

(63) Continuation-in-part of application No. 17/544,960, filed on Dec. 8, 2021, now Pat. No. 11,742,394.

(30) Foreign Application Priority Data

Oct. 27, 2021 (TW) ................................. 110139931
Oct. 13, 2022 (TW) ................................. 111138824

(51) Int. Cl.
  *H10D 62/82*   (2025.01)
  *H10D 30/66*   (2025.01)
  *H10H 20/815*  (2025.01)

(52) U.S. Cl.
  CPC ........... *H10D 62/82* (2025.01); *H10D 30/668* (2025.01); *H10H 20/815* (2025.01)

(58) Field of Classification Search
  CPC .. H10D 62/82; H10D 62/8503; H10D 62/854; H10D 62/357; H10D 30/668;
  (Continued)

(56) References Cited

U.S. PATENT DOCUMENTS

2013/0200432 A1   8/2013  Stau et al.
2014/0091313 A1*  4/2014  Kotani ............... H10D 62/60
                                                257/76
(Continued)

FOREIGN PATENT DOCUMENTS

CN      113437146     9/2021
JP      2007503726    2/2007
(Continued)

OTHER PUBLICATIONS

"Office Action of Taiwan Counterpart Application", issued on Aug. 7, 2023, p. 1-p. 6.
(Continued)

*Primary Examiner* — Dao H Nguyen
(74) *Attorney, Agent, or Firm* — JCIPRNET

(57) ABSTRACT

Provided is a semiconductor substrate with a balance stress. The semiconductor substrate includes a ceramics base, a nucleation layer and a first buffer layer doped with a first dopant. The ceramics base has an off-cut angle other than 0 degree. The nucleation layer is disposed on the ceramics base. The first buffer layer is disposed on the nucleation layer. The first dopant includes C, Fe or a combination thereof. The first buffer layer provides compressive stress to the ceramic base. The concentration of the first dopant in the first buffer layer is increased away from the ceramics base. The curvature of the semiconductor substrate is between 16 km$^{-1}$ and −16 km$^{-1}$.

20 Claims, 13 Drawing Sheets

(58) Field of Classification Search
CPC .......... H10D 30/0297; H10D 30/4732; H10D 30/475; H10H 20/815; H01L 21/02378; H01L 21/02433; H01L 21/02458; H01L 21/02488; H01L 21/02505; H01L 21/0254; H01L 21/02576; H01L 21/02579; H01L 21/02581
See application file for complete search history.

(56) References Cited

U.S. PATENT DOCUMENTS

| | | | | |
|---|---|---|---|---|
| 2014/0353674 | A1* | 12/2014 | Kinoshita | H10D 30/015 257/76 |
| 2015/0001582 | A1* | 1/2015 | Laboutin | H10D 62/854 257/190 |
| 2017/0170283 | A1* | 6/2017 | Laboutin | H01L 21/0257 |
| 2017/0179335 | A1* | 6/2017 | Billingsley | H10H 20/812 |
| 2018/0069086 | A1 | 3/2018 | Ishiguro et al. | |
| 2024/0120435 | A1* | 4/2024 | Raring | H10H 20/01 |

FOREIGN PATENT DOCUMENTS

| | | |
|---|---|---|
| JP | 2009527913 | 7/2009 |
| JP | 2013058626 | 3/2013 |
| JP | 2015043414 | 3/2015 |
| JP | 2018174296 | 11/2018 |
| JP | 2019505459 | 2/2019 |
| JP | 2020532139 | 11/2020 |
| TW | 201448208 | 12/2014 |
| TW | 201801316 | 1/2018 |
| TW | 201824561 | 7/2018 |
| TW | 202129968 | 8/2021 |
| TW | 202210668 | 3/2022 |
| WO | 2017100141 | 6/2017 |

OTHER PUBLICATIONS

"Office Action of Japan Related Application, Application No. 2021-204503", issued on Mar. 22, 2023, p. 1-p. 2.

"Office Action of Taiwan Counterpart Application", issued on Dec. 8, 2023, p. 1-p. 7.

"Notice of allowance of Japan Counterpart Application", issued on Oct. 10, 2023, p. 1-p. 2.

* cited by examiner

US 12,520,548 B2

SEMICONDUCTOR SUBSTRATE WITH BALANCED STRESS

CROSS-REFERENCE TO RELATED APPLICATION

This is a continuation-in-part application of U.S. application Ser. No. 17/544,960, filed on Dec. 8, 2021, which claims the priority benefit of Taiwan application serial no. 110139931, filed on Oct. 27, 2021. This application also claims the priority benefit of Taiwan application serial no. 111138824, filed on Oct. 13, 2022. The entirety of each of the above-mentioned patent applications is hereby incorporated by reference herein and made a part of this specification.

BACKGROUND

Technical Field

The present disclosure relates to a semiconductor device, and particularly relates to a semiconductor substrate with balanced stress.

Description of Related Art

In order to enable a power device to have the low on-resistance, the high switching frequency, the high breakdown voltage and the operation at high temperature, the gallium nitride (GaN) semiconductor device is currently a popular choice for a high-power device.

In a GaN semiconductor device, the semiconductor substrate may affect the quality of the layers formed thereon. For example, when the semiconductor substrate has an excessively large curvature, due to serious warpage, after a film is subsequently formed on the semiconductor substrate, the formed film cannot have good quality.

SUMMARY

The present disclosure provides a semiconductor substrate with balanced stress, in which a buffer layer with gradient dopant concentration may make a base to subject similar tensile stress and compressive stress and may effectively avoid the damage of the base and a layer disposed thereon due to a sudden excessive opposite stress.

The semiconductor substrate with balanced stress of the present disclosure includes a ceramics base, a nucleation layer and a first buffer layer doped with a first dopant. The ceramics base has an off-cut angle other than 0 degree. The nucleation layer is disposed on the ceramics base. The first buffer layer is disposed on the nucleation layer. The first dopant includes C, Fe or a combination thereof. The first buffer layer provides compressive stress to the ceramic base. The concentration of the first dopant in the first buffer layer is increased away from the ceramics base. The curvature of the semiconductor substrate is between 16 $km^{-1}$ and −16 $km^{-1}$.

The semiconductor substrate with balanced stress of the present disclosure includes ceramics base, a nucleation layer, a composite transition layer, a first buffer layer doped with a first dopant and a second buffer layer doped with a second dopant. The nucleation layer is disposed on the ceramics base. The composite transition layer includes a plurality of aluminum-containing layers sequentially stacked on the nucleation layer. The first buffer layer is disposed on the composite transition layer and provides a compressive stress to the ceramic base. The second buffer layer is disposed on the first buffer layer and provides a tensile stress to the ceramic base. In the composite transition layer, an aluminum content of the aluminum-containing layer relatively away from the ceramic base is higher than an aluminum content of the aluminum-containing layer relatively adjacent to the ceramic base. The first dopant comprises C, Fe or a combination thereof. The second dopant comprises Si, Ge or a combination thereof. A concentration of the second dopant in the second buffer layer is increased away from the ceramic base. The semiconductor substrate has a curvature between −10 $km^{-1}$ and 10 $km^{-1}$.

To make the aforementioned more comprehensible, several embodiments accompanied with drawings are described in detail as follows.

DESCRIPTION OF THE EMBODIMENTS

Figure 1A:
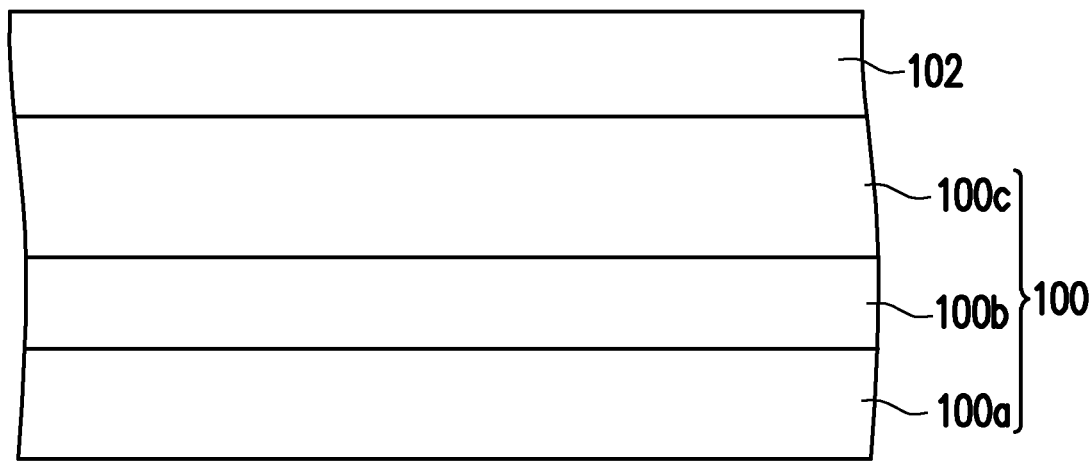
FIGS. 1A to 1B are schematic cross-sectional views of a manufacturing process of a semiconductor substrate of an embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the purpose of easy understanding, the same elements in the following description will be denoted by the same reference numerals.

The terms mentioned in the text, such as "comprising", "including" and "having" are all open-ended terms, i.e., meaning "including but not limited to".

When using terms such as "first" or "second" to describe a device, it is only used to distinguish these devices from each other, and does not limit the order or importance of these devices. Therefore, in some cases, the first device can also be called the second device, and the second device can also be called the first device, and this does not deviate from the scope of the present disclosure.

In addition, in the text, the range represented by "a value to another value" is a summary expression way to avoid listing all the values in the range one by one in the specification. Therefore, the record of a specific numerical range covers any numerical value within the numerical range, as well as a smaller numerical range defined by any numerical value within that numerical range.

Figure 1B:
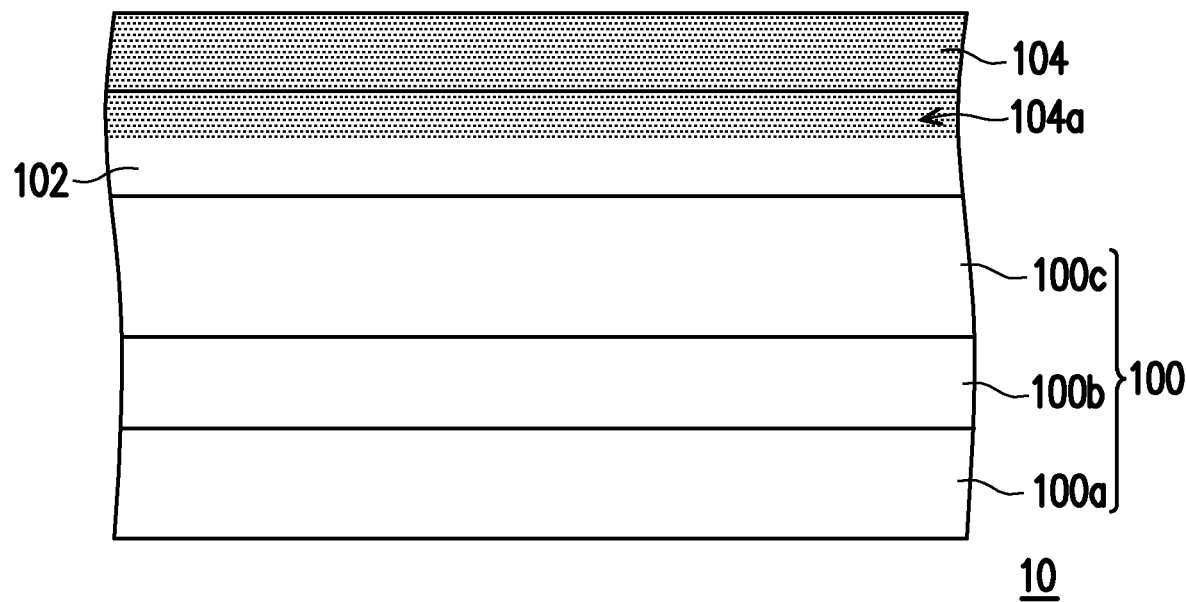

FIGS. 1A to 1B are schematic cross-sectional views of a manufacturing process of a semiconductor substrate of an embodiment of the present disclosure. Referring to FIG. 1A, a composite base 100 is provided. In the present embodiment, the composite base 100 includes a base 100a, an insulating layer 100b and a semiconductor layer 100c. The material of the base 100a is, for example, silicon, aluminum nitride, silicon carbide (SiC), sapphire or a combination thereof. The insulating layer 100b is disposed on the base 100a. The insulating layer 100b is, for example, a silicon oxide layer, but the present disclosure is not limited thereto. The thickness of the insulating layer 100b is, for example, between 100 nm and 200 nm. The semiconductor layer 100c is disposed on the insulating layer 100b. The semiconductor layer 100c is, for example, a silicon layer, a silicon carbide layer or a combination thereof. The thickness of the semiconductor layer 100c is, for example, between 30 nm and 3 μm, preferably between 70 nm and 200 m. In other words, in the present embodiment, the composite base 100 may be a well-known silicon-on-insulator (SOI) composite base or a QST composite base, which has high resistance and is particularly suitable for high-frequency devices. In the present embodiment, the base 100a may have a thermal conductivity greater than 1.4 W/cm·K. As a result, in addition to being used as a supporting base, the composite base 100 may also be used as a heat dissipation base.

Next, a wide bandgap diffusion buffer layer 102 is formed on the semiconductor layer 100c of the composite base 100. In the present embodiment, the energy gap of the wide bandgap diffusion buffer layer 102 is higher than 2.5 eV, preferably between 3.2 eV and 9.1 eV, and more preferably between 4.5 eV and 5.5 eV. The wide bandgap diffusion buffer layer 102 is, for example, a silicon nitride layer, a silicon oxide layer, a zinc oxide layer, an aluminum oxide layer, a gallium oxide layer or a combination thereof. In the present embodiment, the wide bandgap diffusion buffer layer 102 may be an amorphous layer, such as an amorphous silicon nitride layer. In the present embodiment, the thickness of the wide bandgap diffusion buffer layer 102 is between 30 nm and 120 nm, preferably between 35 nm and 100 nm, and more preferably between 40 nm and 90 nm. In the present embodiment, the method for forming the wide bandgap diffusion buffer layer 102 is, for example, a plasma-enhanced chemical vapor deposition (PECVD) process, an E-gun evaporation process or a sputtering deposition process. In addition, in the present embodiment, the wide bandgap diffusion buffer layer 102 may have a resistance value between $1\times10^4$ ohm·cm and $1\times10^{14}$ ohm·cm.

Referring to FIG. 1B, a nucleation layer 104 is formed on the wide bandgap diffusion buffer layer 102 to make the semiconductor substrate 10 of the present embodiment. In the present embodiment, the nucleation layer 104 is an aluminum-containing layer, such as an aluminum nitride layer, but the present disclosure is not limited thereto.

Generally speaking, when the nucleation layer 104 is formed in a high temperature process, the aluminum contained in the nucleation layer 104 may diffuse into the underlying film. The diffusion of aluminum into the semiconductor layer 100c may form a P-type doped conductive layer. In the present embodiment, since the wide bandgap diffusion buffer layer 102 is formed between the semiconductor layer 100c of the composite base 100 and the nucleation layer 104, the aluminum contained in the nucleation layer 104 may diffuse into the wide bandgap diffusion buffer layer 102 during the high temperature process. When the thickness of the wide bandgap diffusion buffer layer 102 is close to the depth of aluminum diffusion, the aluminum contained in the nucleation layer 104 may be prevented from diffusing into the semiconductor layer 100c to form a P-type doped conductive layer, thereby avoiding the leakage current at the composite base 100 during the operation of the formed semiconductor device. In the present embodiment, the thickness of the wide bandgap diffusion buffer layer 102 is greater than the depth of aluminum diffusion, so the aluminum contained in the nucleation layer 104 may be reliably prevented from diffusing into the semiconductor layer 100c. In addition, since the energy gap of the wide bandgap diffusion buffer layer 102 is higher than 2.5 eV, even if aluminum is diffused into the wide bandgap diffusion buffer layer 102, a P-type doped conductive layer may not be formed.

In addition, in the present embodiment, the material of the wide bandgap diffusion buffer layer 102 may be amorphous. Compared with the single crystal material, the amorphous wide bandgap diffusion buffer layer 102 may effectively reduce the diffusion rate of aluminum contained in the nucleation layer 104 into the semiconductor layer 100c and also reduce the depth of aluminum diffusion into the wide bandgap diffusion buffer layer 102. Generally speaking, the depth of aluminum diffusion is between 50 nm and 100 nm. The wide bandgap diffusion buffer layer 102 may reduce the rate and depth of aluminum diffusion, and thus may reduce the depth of aluminum diffusion to between 40 nm and 90 nm. In a case, the thickness of the wide bandgap diffusion buffer layer 102 may be designed to be 40 nm to 90 nm to prevent aluminum from diffusing into the semiconductor layer 100c.

In the present embodiment, during the formation of the nucleation layer 104 or in the subsequent high temperature process, the aluminum contained in the nucleation layer 104 may diffuse into the wide bandgap diffusion buffer layer 102, and thus a diffusion layer 104a is formed. As shown in FIG. 1B, in the present embodiment, the aluminum contained in the nucleation layer 104 diffuses only into the upper portion of the wide bandgap diffusion buffer layer 102, so that the diffusion layer 104a is formed adjacent to the upper surface of the wide bandgap diffusion buffer layer 102, but the present disclosure is not limited thereto. In other embodiments, the aluminum contained in the nucleation layer 104 may diffuse into the entire wide bandgap diffusion buffer layer 102, that is, the thickness of the diffusion layer 104a may be substantially equal to the thickness of the wide bandgap diffusion buffer layer 102.

Figure 2:
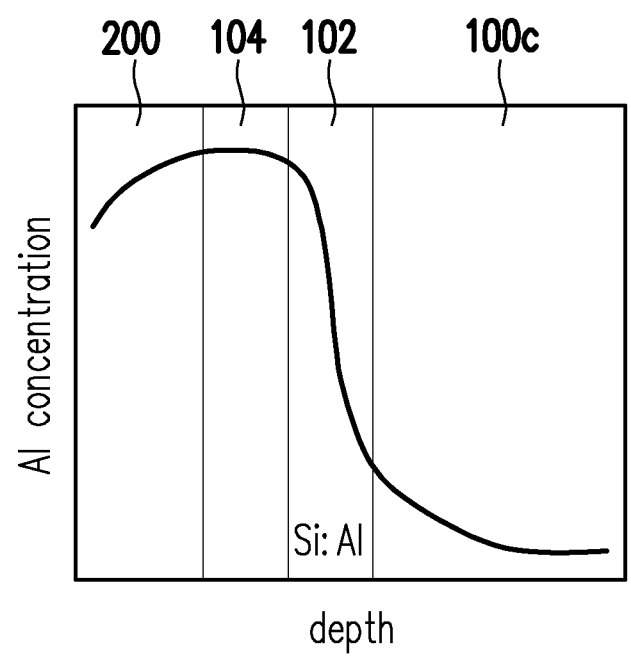
FIG. 2 is a diagram showing the relationship between the aluminum concentration and the diffusion depth of the aluminum in the semiconductor substrate of an embodiment of the present disclosure.

FIG. 2 is a diagram showing the relationship between the aluminum concentration and the diffusion depth of the aluminum in the semiconductor substrate of the embodiment of the present disclosure. Referring to FIG. 2, a buffer layer 200, for example, an AlGaN layer, is formed on the nucleation layer 104 of the semiconductor substrate 10, and the wide bandgap diffusion buffer layer 102 and the nucleation layer 104 are sequentially disposed on the semiconductor layer 100c. In the high temperature process, the aluminum contained in the nucleation layer 104 diffuses upward into the buffer layer 200 and downward into the wide bandgap diffusion buffer layer 102. After the aluminum contained in the nucleation layer 104 diffuses into the wide bandgap diffusion buffer layer 102, the aluminum concentration in the wide bandgap diffusion buffer layer 102 may have a gradient distribution. In other words, in the wide bandgap diffusion buffer layer 102, a relatively large amount of aluminum accumulates in the portion adjacent to the upper surface of the wide bandgap diffusion buffer layer 102, and the aluminum concentration greatly decreases as the diffusion depth increases, so that the aluminum concentration of the portion of the wide bandgap diffusion buffer layer 102 adjacent to the nucleation layer 104 may be greater than that of the portion away from the nucleation layer 104. In addition, since the wide bandgap diffusion buffer layer 102 may reduce or even avoid the diffusion of aluminum contained in the nucleation layer 104 into the semiconductor layer 100c, even when aluminum contained in the nucleation layer 104 penetrates the wide bandgap diffusion buffer layer 102 and diffuses into the semiconductor layer 100c, only a relatively small amount of aluminum is contained in the semiconductor layer 100c. At this time, the aluminum content in the semiconductor layer 100c is, for example, less than $10^{17}$ atom/cm$^3$, or even close to 0. In this way, when the semiconductor substrate 10 is used as the substrate of a transistor, an LED or other electronic device, it may effectively reduce or avoid leakage current and electrical signal loss of the transistor or the LED during operation.

The following will take the semiconductor substrate 10 as an example to describe a transistor including the semiconductor substrate of the present disclosure.

Figure 3:
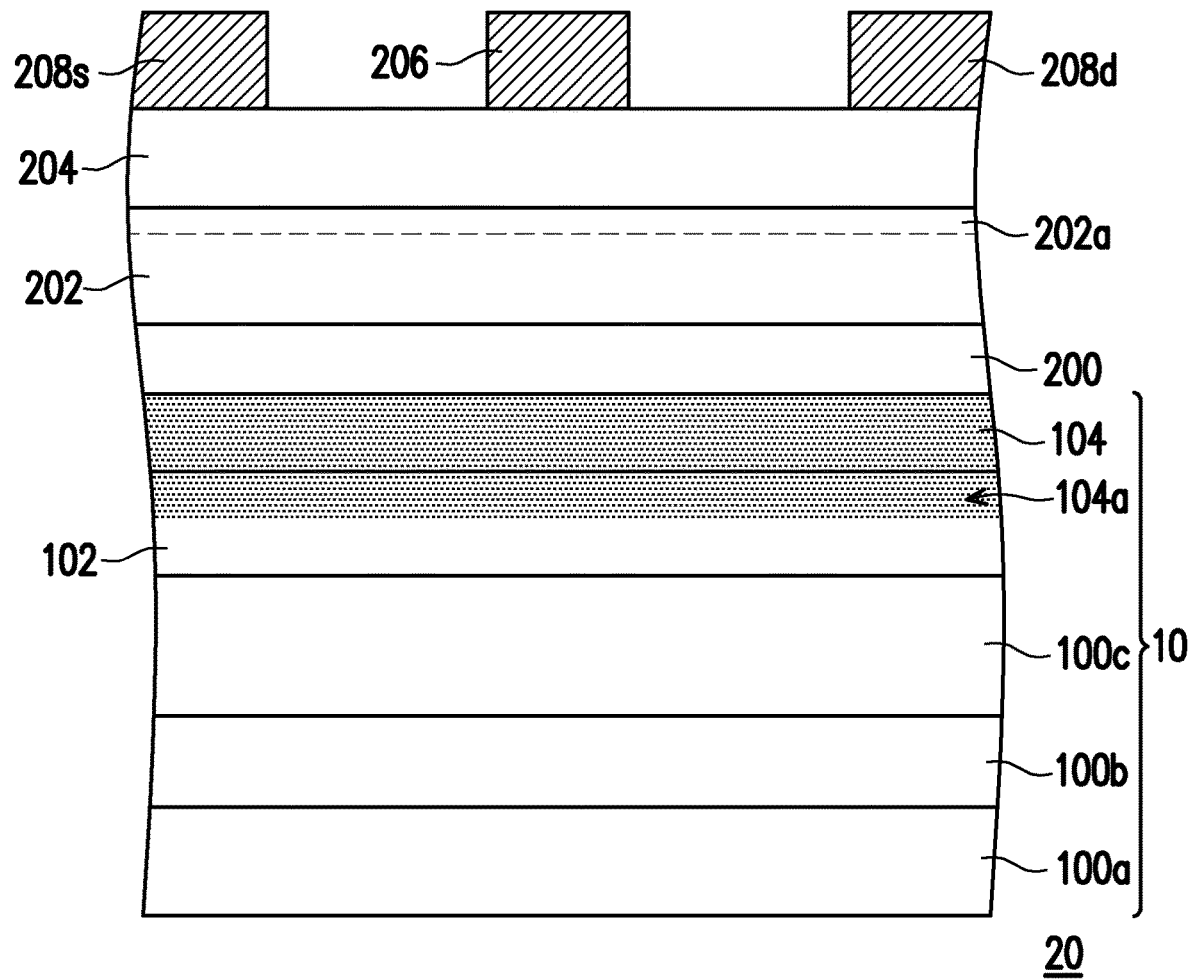
FIG. 3 is a schematic cross-sectional view of a transistor of an embodiment of the present disclosure.

FIG. 3 is a schematic cross-sectional view of a transistor of an embodiment of the present disclosure. Referring to FIG. 3, during the manufacturing process of the transistor 20, a buffer layer 200 may be formed on the nucleation layer 104 of the semiconductor substrate 10. The buffer layer 200 is, for example, an AlGaN layer, but the present disclosure is not limited thereto. Since the difference in the lattice constant between the composite base 100 and the GaN layer grown thereon, stress may be caused and thus affects the quality of the epitaxial layer on the composite base 100. The buffer layer 200 is added between the composite base 100 and the channel layer 202 to balance the stress between the composite base 100 and the epitaxial layer, such as the channel layer 202, subsequently formed thereon. In the present embodiment, the thickness of the buffer layer 200 is, for example, between 100 nm and 2.3 μm. In other embodiments, the buffer layer 200 may be omitted, and the channel layer 202 may directly contact the nucleation layer 104.

Then, the channel layer 202 and a barrier layer 204 are formed in sequence. The channel layer 202 is, for example, a GaN layer. The thickness of the channel layer 202 is, for example, between 20 nm and 100 nm. The barrier layer 204 is, for example, an AlGaN layer, an AlInN layer, an AlN layer, an AlGaInN layer or a combination thereof. The thickness of the barrier layer 204 is, for example, between 5 nm and 50 nm. The channel layer 202 has a two-dimensional electron gas (2DEG) 202a located below an interface between the channel layer 202 and the barrier layer 204. After that, a gate 206, a source 208s and a drain 208d are formed on the barrier layer 204, wherein the gate 206 is located between the source 208s and the drain 208d. The material of the gate 206 is, for example, Ni, Mo, W, TiN or a combination thereof. The material of the source 208s and the drain 208d is, for example, Al, Ti, Au or alloy thereof, or may be other material capable of forming ohmic contact with Group III-V compounds.

In the transistor 20, since the semiconductor substrate 10 is used as the substrate, the leakage current may be effectively reduced or avoided during operation of the transistor 20, and the loss of electrical signals may be reduced or avoided.

In particular, in the present embodiment, transistor 20 is an example of a high electron mobility transistor (HEMT), but the structure of the transistor in the present disclosure is not limited to the HEMT. In other embodiments, the transistor may have various well-known structures, as long as the semiconductor substrate of the present disclosure is used as its substrate.

Figure 4:
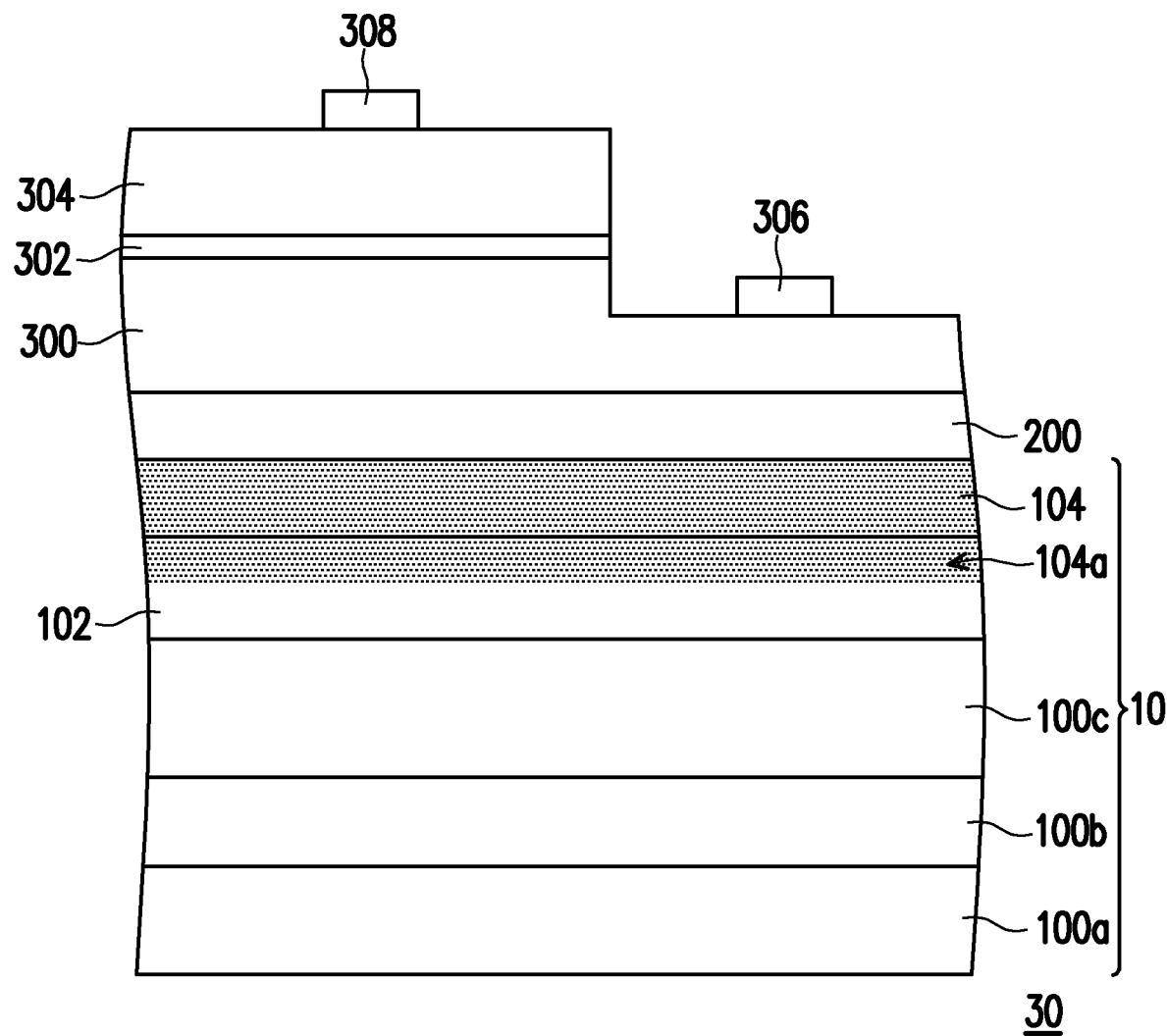
FIG. 4 is a schematic cross-sectional view of a light emitting diode (LED) of an embodiment of the present disclosure.

In addition, when the semiconductor substrate of the present disclosure is used as the substrate of an LED, various LED structures may be formed on the semiconductor substrate of the present disclosure, which is not limited by the present disclosure. For example, as shown in FIG. 4, the LED 30 includes the semiconductor substrate 10, the buffer layer 200, a first conductive type GaN layer 300, a light emitting layer 302, a second conductive type GaN layer 304, a first electrode 306 and a second electrode 308. The light emitting layer 302 is disposed between the first conductive type GaN layer 300 and the second conductive type GaN layer 304. The first electrode 306 is disposed on the first conductive type GaN layer 300. The second electrode 308 is disposed on the second conductive type GaN layer 304. The material of the first conductive type GaN layer 300, the light emitting layer 302, the second conductive type GaN layer 304, the first electrode 306 and the second electrode 308 are well known to those skilled in the art, and will not be further described here.

On the other hand, in the following embodiments, the base may be warped upward, i.e., in a direction of growth of the layers on the substrate, after being subjected the tensile stress, and the curvature of the semiconductor substrate may be positive. Conversely, when the base is subjected to the compressive stress, and the base may be warped downward, making the curvature of the semiconductor substrate negative.

Figure 5A:
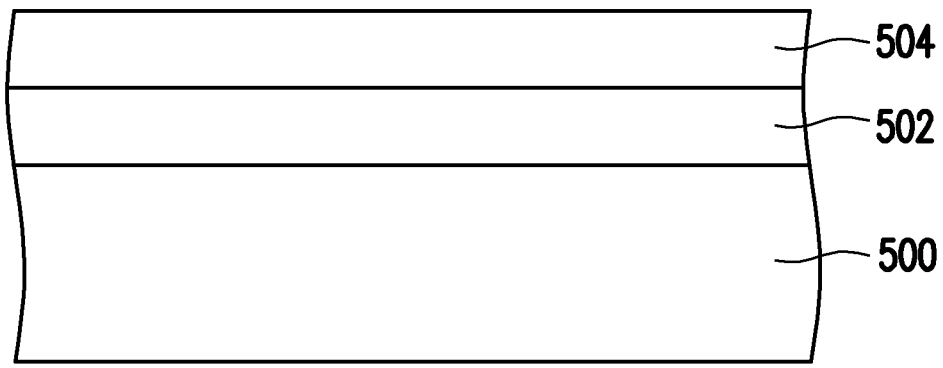
FIGS. 5A to 5B are schematic cross-sectional views of a manufacturing process of the semiconductor substrate of an embodiment of the present disclosure.
Figure 5B:
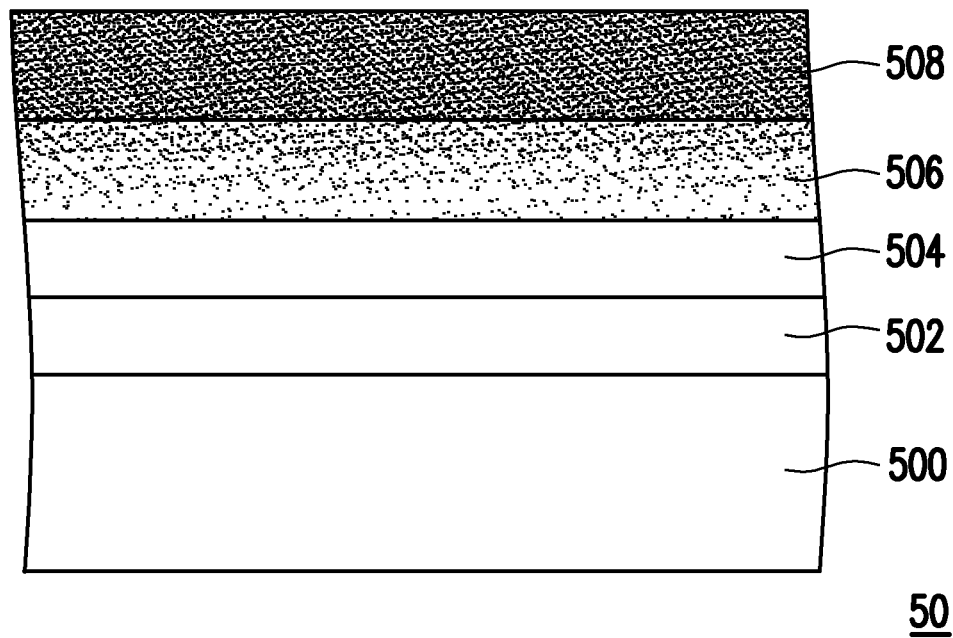

FIGS. 5A to 5B are schematic cross-sectional views of a manufacturing process of the semiconductor substrate of an embodiment of the present disclosure. In the present embodiment, the formed semiconductor substrate may have balanced stress, and thus may have a lower curvature to facilitate epitaxial growth of subsequent layers. In the present embodiment, the curvature of the semiconductor substrate with balanced stress is between 16 km$^{-1}$ and −16 km$^{-1}$.

Referring to FIG. 5A, a ceramic base 500 is provided. The ceramic base 500 is, for example, a QST base, an AlN base, an Al$_2$O$_3$ base, a ZnO base or a SiC base. In the present embodiment, the ceramic base 500 is SiC base and has an off-cut angle other than 0 degrees, but the present disclosure is not limited thereto. For example, the ceramic base 500 may have an off-cut angle of 4 degrees, but the present disclosure is not limited thereto. In other embodiments, the ceramic base 500 may have a off-cut angle of 8 degrees, 12 degrees, etc. Furthermore, the thickness of the ceramic base 500 is, for example, less than 500 μm. In the present embodiment, the thickness of the ceramic base 500 is less than 450 μm. For example, the thickness of the ceramic base 500 may be 350 μm. In addition, in the present embodiment, the diameter of the ceramic base 500 is, for example, between 4 inches and 6 inches. When the stress of the ceramic base is unbalanced, warpage occurs. Warpage becomes more severe as the thickness of the ceramic base decreases and the diameter of the ceramic base increases. In the present embodiment, the semiconductor substrate of the present embodiment may have balanced stress, even if the thickness of the ceramic base 500 is less than 350 μm and the diameter of the ceramic base 500 is 4 inches to 6 inches, the semiconductor substrate may not be severely warped due to the epitaxial structure that may balances stress formed on the ceramic base 500, and thus the curvature of the semiconductor substrate may be controlled between 16 km$^{-1}$ and −16 km$^{-1}$.

Next, a nucleation layer 502 is formed on the ceramic base 500. In the present embodiment, the nucleation layer 502 is an aluminum nitride layer, but the present disclosure is not limited thereto. The thickness of the nucleation layer 502 is, for example, between 10 nm and 100 nm. The nucleation layer 502 may provide the tensile stress to the ceramic base 500. At this time, the curvature of the ceramic base 500 is, for example, between 20 km$^{-1}$ and 50 km$^{-1}$.

Then, an undoped buffer layer 504 may be formed on the nucleation layer 502. The method for forming the undoped buffer layer 504 is, for example, an epitaxial growth process. In the present embodiment, the undoped buffer layer 504 is a gallium nitride layer, but the present disclosure is not limited thereto. The thickness of the undoped buffer layer 504 is, for example, between 50 nm and 500 nm. The undoped buffer layer 504 may provide the compressive stress to the ceramic base 500. At this time, the curvature of the ceramic base 500 is, for example, between −10 km$^{-1}$ and 20 km$^{-1}$. The undoped buffer layer 504 is optional. In other embodiments, the undoped buffer layer 504 may be omitted according to actual needs.

Referring to FIG. 5B, a buffer layer 506 doped with a first dopant is formed on the undoped buffer layer 504. The method for forming the buffer layer 506 is, for example, an epitaxial growth process. In the present embodiment, the first dopant may be C, Fe or a combination thereof. In addition, in the present embodiment, the buffer layer 506 is a gallium nitride layer, but the present disclosure is not limited thereto. The thickness of the buffer layer 506 is, for example, between 50 nm and 500 nm. In the present embodiment, since the size of C or Fe as the first dopant is larger than that of N or Ga, the formed buffer layer 506 may have a larger crystal lattice. Therefore, the buffer layer 506 may provide the compressive stress to the ceramic base 500. In detail, in the case where the first dopant is C, C may replace N from GaN in the buffer layer 506 to create a larger lattice. Furthermore, in the case where the first dopant is F, F may replace Ga from GaN in the buffer layer 506 to create a larger lattice.

Importantly, in the buffer layer 506, the concentration of the first dopant increases away from the ceramic base 500. In the present embodiment, the concentration of the first dopant in the buffer layer 506 is increased from 5×10$^{16}$ atom/cm$^3$ to 8×10$^{18}$ atom/cm$^3$. That is, during forming the buffer layer 506, the concentration of the first dopant is gradually increased, so that the ceramic base 500 may be gradually provided with increased compressive stress, so as to prevent the ceramic base 500 and the layers formed thereon from being damaged due to a sudden excessive opposite stress (compressive stress).

Next, a buffer layer 508 doped with the first dopant is formed on the buffer layer 506 to form the semiconductor substrate 50 of the present embodiment. The method for forming the buffer layer 508 is, for example, an epitaxial growth process. In the present embodiment, same as the buffer layer 506, the buffer layer 508 is a gallium nitride layer, and the first dopant in the buffer layer 508 may be C, Fe or a combination thereof. Therefore, the buffer layer 508 may provide the compressive stress to the ceramic base 500. In addition, the thickness of the buffer layer 508 is greater than 500 nm, for example.

In the buffer layer 508, the concentration of the first dopant is constant and not lower than the maximum concentration of the first dopant in the buffer layer 506. In the present embodiment, the concentration of the first dopant in the buffer layer 508 is not less than 8×10$^{18}$ atom/cm$^3$. Since the buffer layer 506 with the gradient first dopant concentration is formed before the buffer layer 508 with the higher first dopant concentration, which may provide the larger compressive stress, the ceramic base 500 and the layers formed thereon may be effectively prevented from being damaged due to a sudden excessive opposite stress (compressive stress).

In the semiconductor substrate 50 of the present embodiment, the nucleation layer 502 provides the tensile stress to the ceramic base 500, and the undoped buffer layer 504, the buffer layer 506 and the buffer layer 508 formed on the nucleation layer 502 provide the compressive stress to the ceramic base 500. Therefore, by adjusting the concentrations of the first dopant in the buffer layer 506 and the buffer layer 508, the tensile stress and compressive stress subjected by the ceramic base 500 may be similar. Since the ceramic base 500 has balanced stress, the ceramic base 500 may have a lower curvature, which is beneficial to the epitaxial growth of the subsequent layers.

In the present embodiment, the buffer layer 506 with the gradient first dopant concentration and the buffer layer 508 with the constant first dopant concentration are sequentially disposed on the undoped buffer layer 504, but the present disclosure is not limited thereto. In other embodiments, only the buffer layer with the gradient first dopant concentration is disposed on the undoped buffer layer 504.

Figure 6:
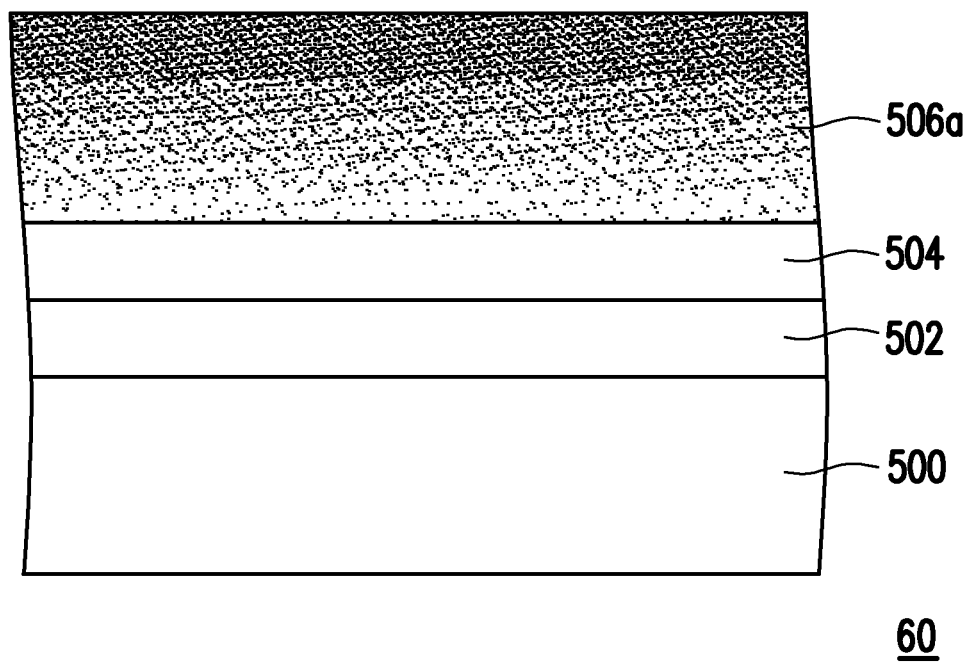
FIG. 6 is a schematic cross-sectional view of a semiconductor substrate of an embodiment of the present disclosure.

FIG. 6 is a schematic cross-sectional view of a semiconductor substrate of an embodiment of the present disclosure. In the present embodiment, the same elements as those in FIG. 5B will be denoted by the same reference numerals and will not be described again.

Referring to FIG. 6, in the semiconductor substrate 60 of the present embodiment, a buffer layer 506a with the gradient first dopant concentration is disposed on the undoped buffer layer 504. The method for forming the buffer layer 506a is, for example, an epitaxial growth process. The first dopant may be C, Fe or a combination thereof. In addition, in the present embodiment, the buffer layer 506a is a gallium nitride layer, but the present disclosure is not limited thereto. The first dopant concentration of the buffer layer 506a is increased away from the ceramic base 500, and the first dopant concentration is increased to provide a compressive stress sufficient to make the ceramic base 500 to subject similar tensile stress and compressive stress. For example, the concentration of the first dopant in the buffer layer 506a may be increased from 5×10$^{16}$ atom/cm$^3$ to 8×10$^{18}$ atom/cm$^3$ or more. Also, in this case, the thickness of buffer layer 506a may be the sum of the thicknesses of buffer layer 506 and buffer layer 508 in semiconductor substrate 50.

The application of the semiconductor substrate with balanced stress of the present disclosure will be described below by taking the semiconductor substrate 50 as an example. For example, the semiconductor substrate 50 may be used in the fabrication of a transistor. The semiconductor substrate 50 may be replaced with the semiconductor substrate 60 depending on actual needs.

Figure 7:
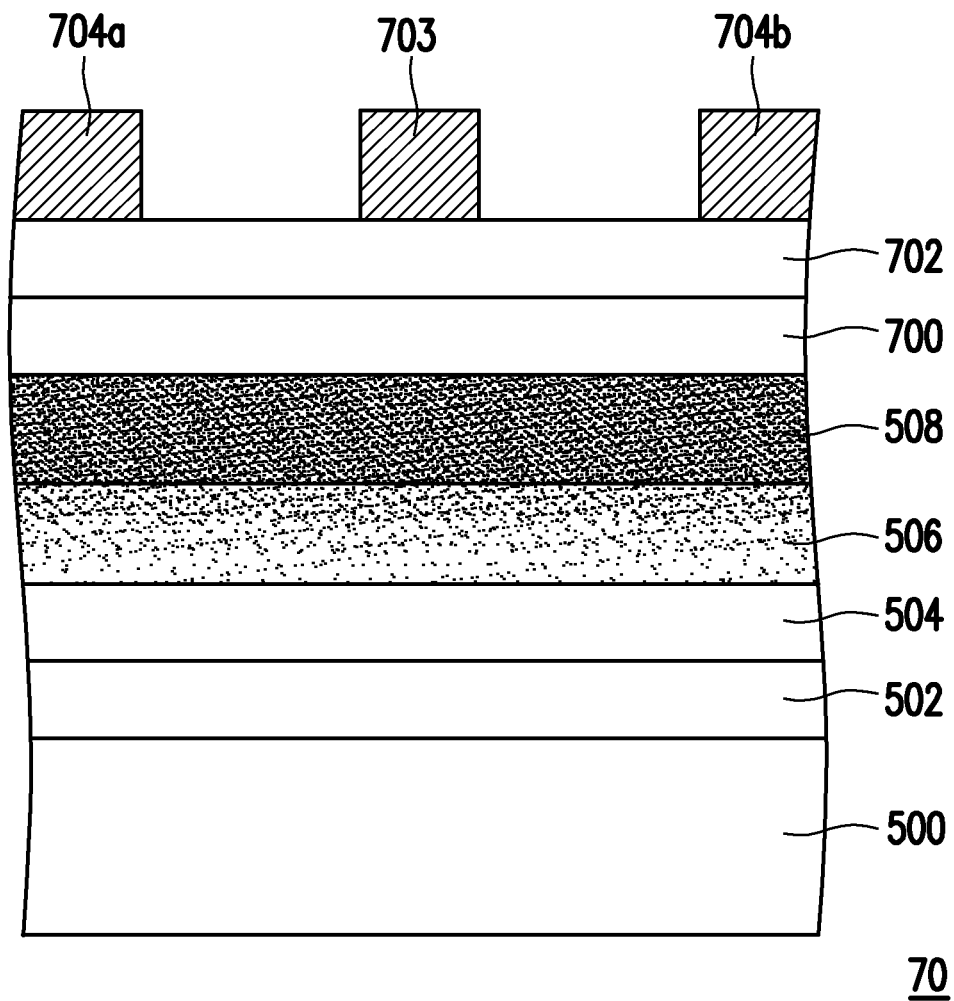
FIG. 7 is a schematic cross-sectional view of a transistor of an embodiment of the present disclosure.

FIG. 7 is a schematic cross-sectional view of a transistor of an embodiment of the present disclosure. In the present embodiment, the same elements as those in FIG. 5B will be denoted by the same reference numerals and will not be described again.

Referring to FIG. 7, during the manufacturing process of the transistor 70, a channel layer 700 and a barrier layer 702 may be sequentially formed on the buffer layer 508 of the semiconductor substrate 50. The method for forming the channel layer 700 is, for example, an epitaxial growth process. In the present embodiment, the channel layer 700 is a gallium nitride layer, but the present disclosure is not limited thereto. The thickness of the channel layer 700 is, for example, between 150 nm and 300 nm. The method for forming the barrier layer 702 is, for example, an epitaxial growth process. In the present embodiment, the barrier layer 702 may be an aluminum gallium nitride layer ($Al_xGa_{1-x}N$ in which X is a molar ratio and X may be between 0.2 and 0.25), but the present disclosure is not limited thereto. The thickness of the barrier layer 702 is, for example, between 15 nm and 25 nm. After that, a gate 703, a source 704a and a drain 704b are formed on the barrier layer 702, wherein the gate 703 is located between the source 704a and the drain 704b. The material of the gate 703 is, for example, Ni, Pt, Pd, Au or a combination thereof. The materials of the source 704a and the drain 704b are, for example, Al, Ti, In, Cr, V, Ta, TiN, Au or alloys thereof, or other materials capable of forming ohmic contact with the Group III-V compound.

In the transistor 70, since the ceramic base 500 has balanced stress and may have a lower curvature, the channel layer 700 and the barrier layer 702 formed on the ceramic base 500 may have good quality, and thus the transistor 70 may have better electrical performance.

The aluminum-containing barrier layer 702 of the transistor 70 was tested. Compared with the poor uniformity (the difference is greater than 2.0%) of the aluminum content of the barrier layer in the general transistor, the aluminum content of the barrier layer 702 in the transistor 70 has a higher uniformity (the difference is less than 2.0%). That is, the barrier layer 702 is has good quality.

FIGS. 8A to 8D are schematic cross-sectional views of a manufacturing process of a semiconductor substrate of an embodiment of the present disclosure. In the present embodiment, the formed semiconductor substrate may have balanced stress, and thus may have a lower curvature to facilitate epitaxial growth of subsequent layers. In the present embodiment, the curvature of the semiconductor substrate with balanced stress is between $-10$ $km^{-1}$ and $10$ $km^{-1}$.

Figure 8A:
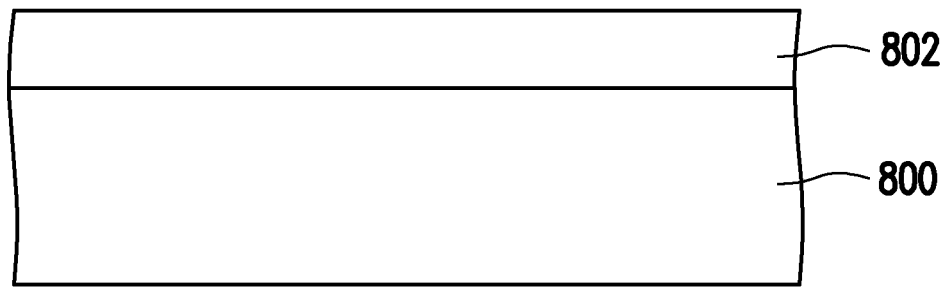
FIGS. 8A to 8D are schematic cross-sectional views of a manufacturing process of a semiconductor substrate of an embodiment of the present disclosure.

Referring to FIG. 8A, a ceramic base 800 is provided. The ceramic base 800 is, for example, a QST base, an AlN base, an $Al_2O_3$ base, a ZnO base or a SiC base. In the present embodiment, the ceramic base 800 is the QST base, but the present disclosure is not limited thereto.

Next, a nucleation layer 802 is formed on the ceramic base 800. In the present embodiment, the nucleation layer 802 is an aluminum nitride layer, but the present disclosure is not limited thereto. The thickness of the nucleation layer 802 is, for example, between 15 nm and 150 nm. The nucleation layer 802 may provide the tensile stress to the ceramic base 800. At this time, the curvature of the ceramic base 800 is, for example, between 50 $km^{-1}$ and 80 $km^{-1}$.

Figure 8B:
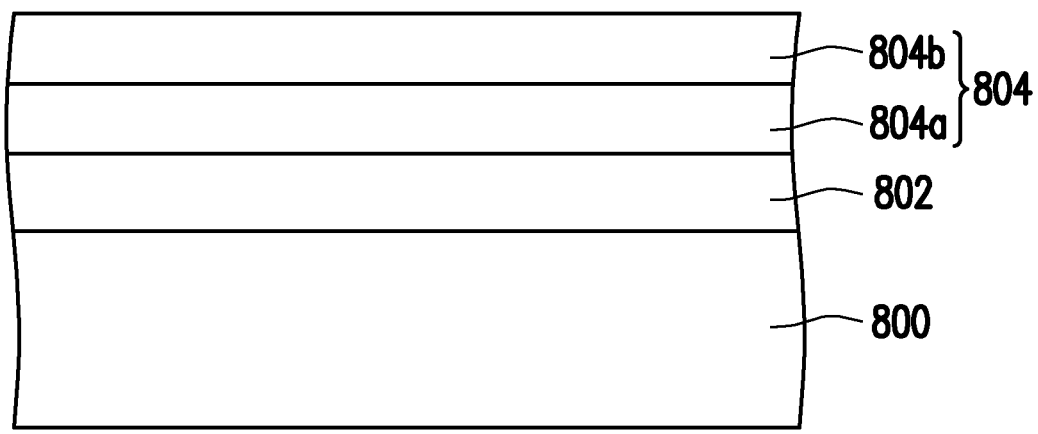

Referring to FIG. 8B, a composite transition layer 804 is formed on the nucleation layer 802. The method for forming the composite transition layer 804 is, for example, an epitaxial growth process. The thickness of the composite transition layer 804 is, for example, greater than 300 nm. The composite transition layer 804 includes a plurality of aluminum-containing layers. In the present embodiment, the aluminum-containing layer may be an aluminum gallium nitride layer ($Al_YGa_{1-Y}N$ in which Y is the molar fraction). In the composite transition layer 804, the aluminum content of the aluminum-containing layer relatively away from the ceramic base 800 is higher than the aluminum content of the aluminum-containing layer relatively adjacent to the ceramic base 800. Due to the difference in the lattice size caused by the difference in the aluminum content, the composite transition layer 804 may be regarded as a lattice gradient layer, and may provide gradient compressive stress to the ceramic base 800. At this time, the curvature of the ceramic base 800 is, for example, between 0 $km^{-1}$ and 20 $km^{-1}$. In addition, in the present embodiment, the composite transition layer 804 includes two aluminum-containing layers, but the present disclosure is not limited thereto. In other embeddings, the composite transition layer 804 may include more aluminum-containing layers sequentially stacked on the nucleation layer 802.

In detail, in the present embodiment, the composite transition layer 804 includes two aluminum-containing layers formed on the nucleation layer 802 in sequence. In the composite transition layer 804, the aluminum content of the aluminum-containing layer 804b relatively away from the ceramic base 800 is higher than the aluminum content of the aluminum-containing layer 804a relatively adjacent to the ceramic base 800. As such, after forming the aluminum-containing layer 804a, the curvature of the ceramic base 800 is, for example, between 30 $km^{-1}$ and 60 $km^{-1}$, and then after forming the aluminum-containing layer 804b, the curvature of the ceramic base 800 is, for example, between 0 $km^{-1}$ and 20 $km^{-1}$.

In the present embodiment, the aluminum molar ratio Y in each aluminum-containing layer is, for example, between 0.1 and 0.9. In addition, in the composite transition layer 804, the difference between the aluminum molar ratios Y in the adjacent two aluminum-containing layers is, for example, between 0.4/Z and 0.9/Z, wherein Z represents the number of aluminum-containing layers in the composite transition layer 804. In the present embodiment, the composite transition layer 804 includes the aluminum-containing layer 804a and the aluminum-containing layer 804b, so the difference in the aluminum molar ratio Y between the aluminum-containing layer 804a and the aluminum-containing layer 804b is between 0.2 and 0.45.

Figure 8C:
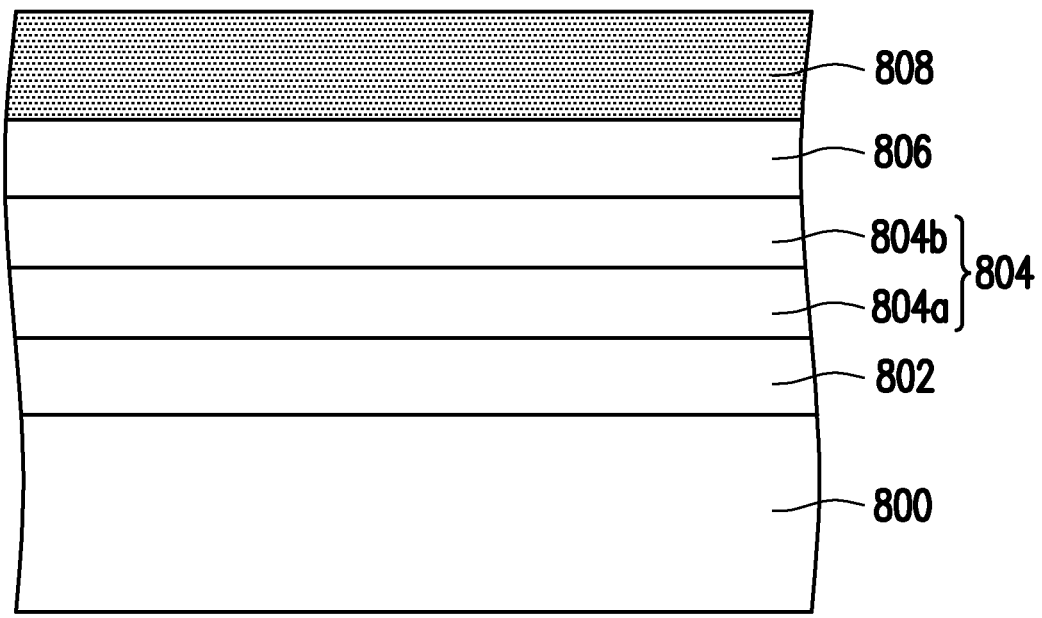

Referring to FIG. 8C, an undoped buffer layer 806 may be formed on the composite transition layer 804. The method for forming the undoped buffer layer 806 is, for example, an epitaxial growth process. In the present embodiment, the undoped buffer layer 806 is a gallium nitride layer, but the present disclosure is not limited thereto. The thickness of the undoped buffer layer 806 is, for example, between 250 nm and 500 nm. The undoped buffer layer 806 may provide the compressive stress to the ceramic base 800. At this time, the curvature of the ceramic base 800 is, for example, between 0 $km^{-1}$ and $-20$ $km^{-1}$. The undoped buffer layer 806 is optional. In other embodiments, the undoped buffer layer 806 may be omitted according to actual needs.

Afterwards, a buffer layer 808 doped with the first dopant is formed on the undoped buffer layer 806. The method for forming the buffer layer 808 is, for example, an epitaxial growth process. In the present embodiment, the first dopant may be C, Fe or a combination thereof. The concentration of the first dopant in the buffer layer 808 is, for example, between $5 \times 10^{17}$ $atom/cm^3$ to $1 \times 10^{19}$ $atom/cm^3$. In addition, in the present embodiment, the buffer layer 808 is a gallium nitride layer, but the present disclosure is not limited thereto. The thickness of the buffer layer 808 is, for example, between 0.5 µm and 1 µm. In the present embodiment, since the size of C or Fe as the first dopant is larger than that of N or Ga, the formed buffer layer 808 may have a larger crystal lattice. Therefore, the buffer layer 808 may provide the compressive stress to the ceramic base 800. At this time, the curvature of the ceramic base 800 is, for example, between −40 $km^{-1}$ and −60 $km^{-1}$.

Figure 8D:
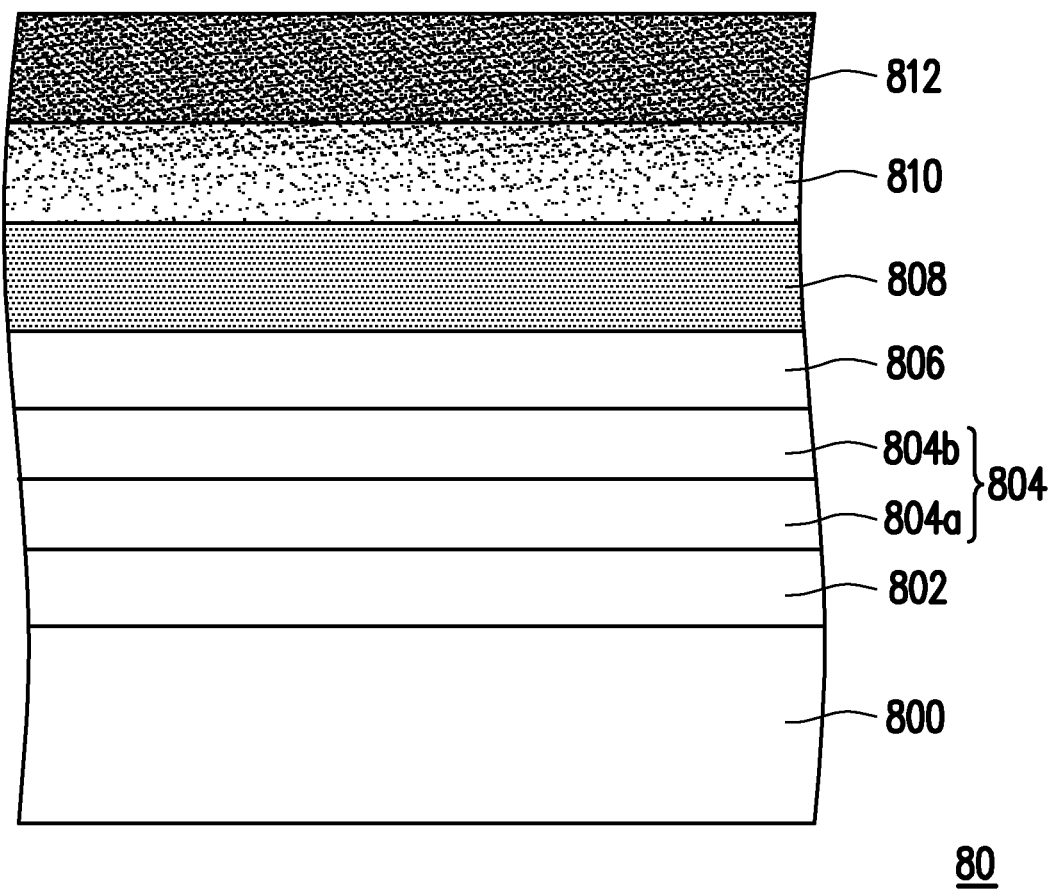

Referring to FIG. 8D, a buffer layer 810 doped with a second dopant is formed on the buffer layer 808. The method for forming the buffer layer 810 is, for example, an epitaxial growth process. In the present embodiment, the second dopant may be Si, Ge or a combination thereof. In addition, in the present embodiment, the buffer layer 810 is a gallium nitride layer, but the present disclosure is not limited thereto. The thickness of the buffer layer 810 is, for example, between 100 nm and 500 nm. In the present embodiment, since the size of Si or Ge as the second dopant is smaller than that of N or Ga, the formed buffer layer 810 may have a smaller crystal lattice. Therefore, the buffer layer 810 may provide the tensile stress to the ceramic base 800. At this time, the curvature of the ceramic base 800 is, for example, between −20 $km^{-1}$ and −40 $km^{-1}$.

Importantly, in the buffer layer 810, the concentration of the second dopant increases away from the ceramic base 800. In the present embodiment, the concentration of the second dopant in the buffer layer 810 is increased from $1 \times 10^{17}$ atom/$cm^3$ to $1 \times 10^{19}$ atom/$cm^3$. That is, during forming the buffer layer 810, the concentration of the second dopant is gradually increased, so the ceramic base 800 may be gradually provided with increased tensile stress, so as to prevent the ceramic base 800 and the layers formed thereon from being damaged due to a sudden excessive opposite stress (tensile stress).

Then, a buffer layer 812 doped with the second dopant is formed on the buffer layer 810 to form the semiconductor substrate 80 of the present embodiment. The method for forming the buffer layer 812 is, for example, an epitaxial growth process. In the present embodiment, same as the buffer layer 810, the second dopant in the buffer layer 812 may be Si, Ge or a combination thereof. Therefore, the buffer layer 812 may provide the tensile stress to the ceramic base 800. The thickness of the buffer layer 812 is greater than 500 nm, for example.

In the buffer layer 812, the concentration of the second dopant is constant and not lower than the maximum concentration of the second dopant in the buffer layer 810. In the present embodiment, the concentration of the second dopant in the buffer layer 812 is not less than $8 \times 10^{18}$ atom/$cm^3$. Since the buffer layer 810 with the gradient second dopant concentration is formed before the buffer layer 812 with the higher second dopant concentration, which may provide the larger tensile stress, the ceramic base 800 and the layers formed thereon may be effectively prevented from being damaged due to a sudden excessive opposite stress (tensile stress). In other embodiments, the concentration of the second dopant in the buffer layer 812 may be higher than $1 \times 10^{19}$ atom/$cm^3$.

In the semiconductor substrate 80 of the present embodiment, before the buffer layer 810 and the buffer layer 812 are formed, the total stress subjected by the ceramic base 800 is the compressive stress, so the tensile stress and the compressive stress subjected by the ceramic base 800 are similar by forming the buffer layer 810 and the buffer layer 812. Since the ceramic base 800 has balanced stress, the ceramic base 800 may have a lower curvature, which is beneficial to the epitaxial growth of the subsequent layers.

In the present embodiment, the buffer layer 810 with the gradient second dopant concentration and the buffer layer 812 with the constant second dopant concentration are sequentially disposed on the buffer layer 808, but the present disclosure is not limited thereto. In other embodiments, only the buffer layer with gradient second dopant concentration is disposed on the buffer layer 808.

Figure 9:
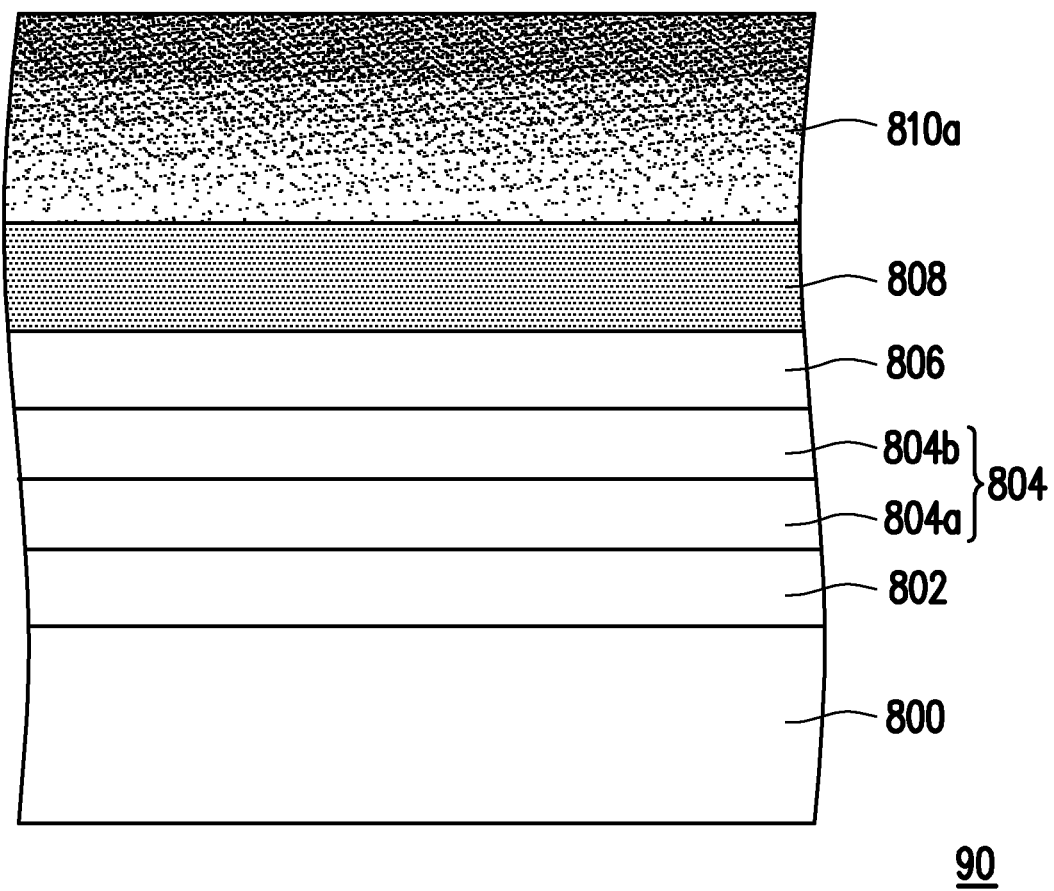
FIG. 9 is a schematic cross-sectional view of a semiconductor substrate of an embodiment of the present disclosure.

FIG. 9 is a schematic cross-sectional view of a semiconductor substrate of an embodiment of the present disclosure. In the present embodiment, the same elements as those in FIG. 8D will be denoted by the same reference symbols and will not be described again.

Referring to FIG. 9, in the semiconductor substrate 90 of the present embodiment, a buffer layer 810a with the gradient second dopant concentration is disposed on the buffer layer 808. The method for forming the buffer layer 810a is, for example, an epitaxial growth process. The second dopant may be Si, Ge or a combination thereof. In addition, in the present embodiment, the buffer layer 810a is a gallium nitride layer, but the present disclosure is not limited thereto. The second dopant concentration of the buffer layer 810a is increased away from the ceramic base 800, and the second dopant concentration is increased to provide a tensile stress sufficient to make the ceramic base 800 to subject similar tensile stress and compressive stress. For example, the concentration of the second dopant in the buffer layer 810a may be increased from $1 \times 10^{17}$ atom/$cm^3$ to $1 \times 10^{19}$ atom/$cm^3$ or more. Also, in this case, the thickness of the buffer layer 810a may be the sum of the thicknesses of the buffer layer 810 and the buffer layer 812 in the semiconductor substrate 80.

The application of the semiconductor substrate with balanced stress of the present disclosure will be described below by taking the semiconductor substrate 80 as an example. For example, the semiconductor substrate 80 may be used in the fabrication of a transistor. The semiconductor substrate 80 may be replaced with the semiconductor substrate 90 depending on actual needs.

Figure 10A:
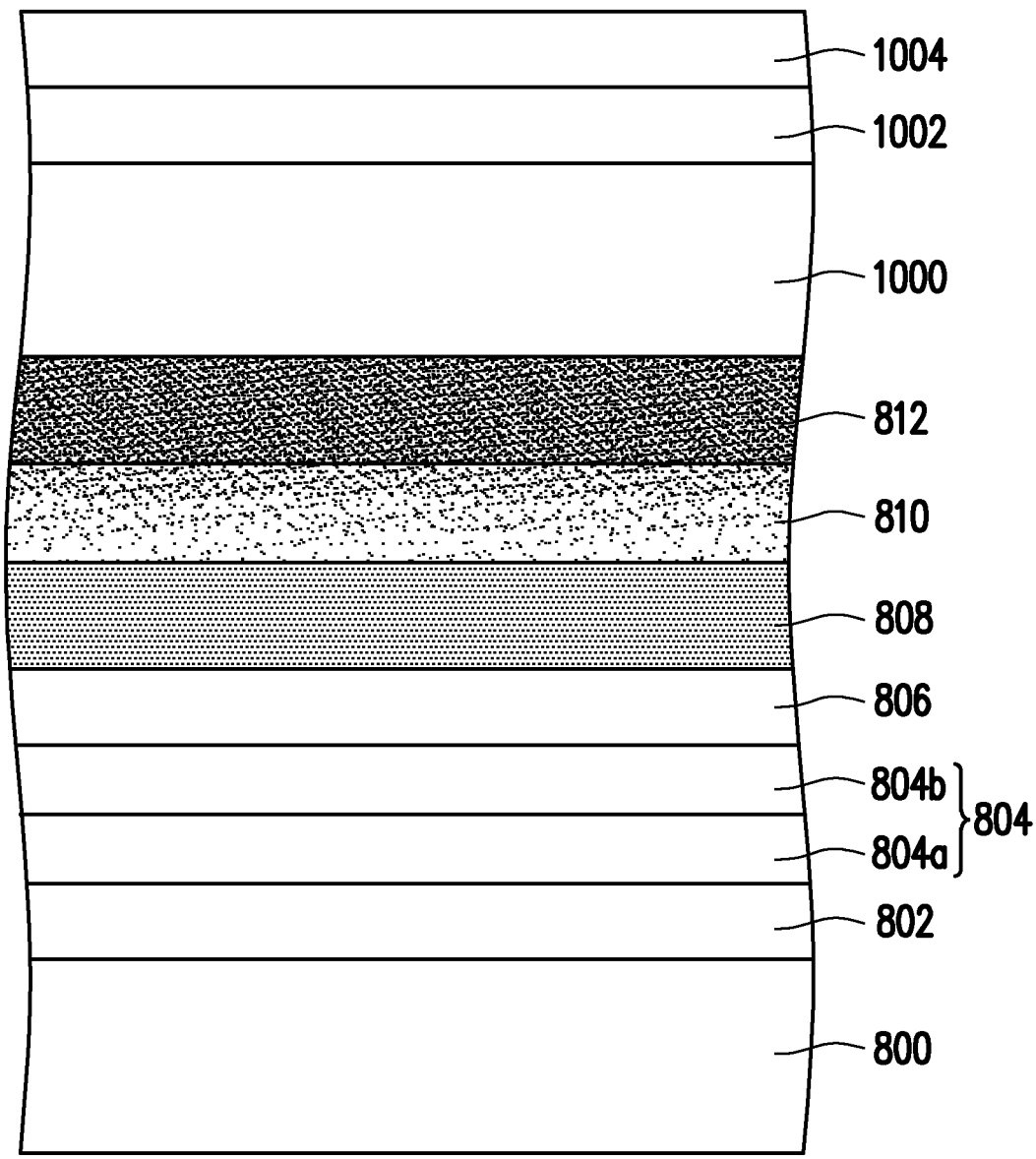
FIGS. 10A to 10B are schematic cross-sectional views of a manufacturing process of a transistor of an embodiment of the present disclosure.
Figure 10B:
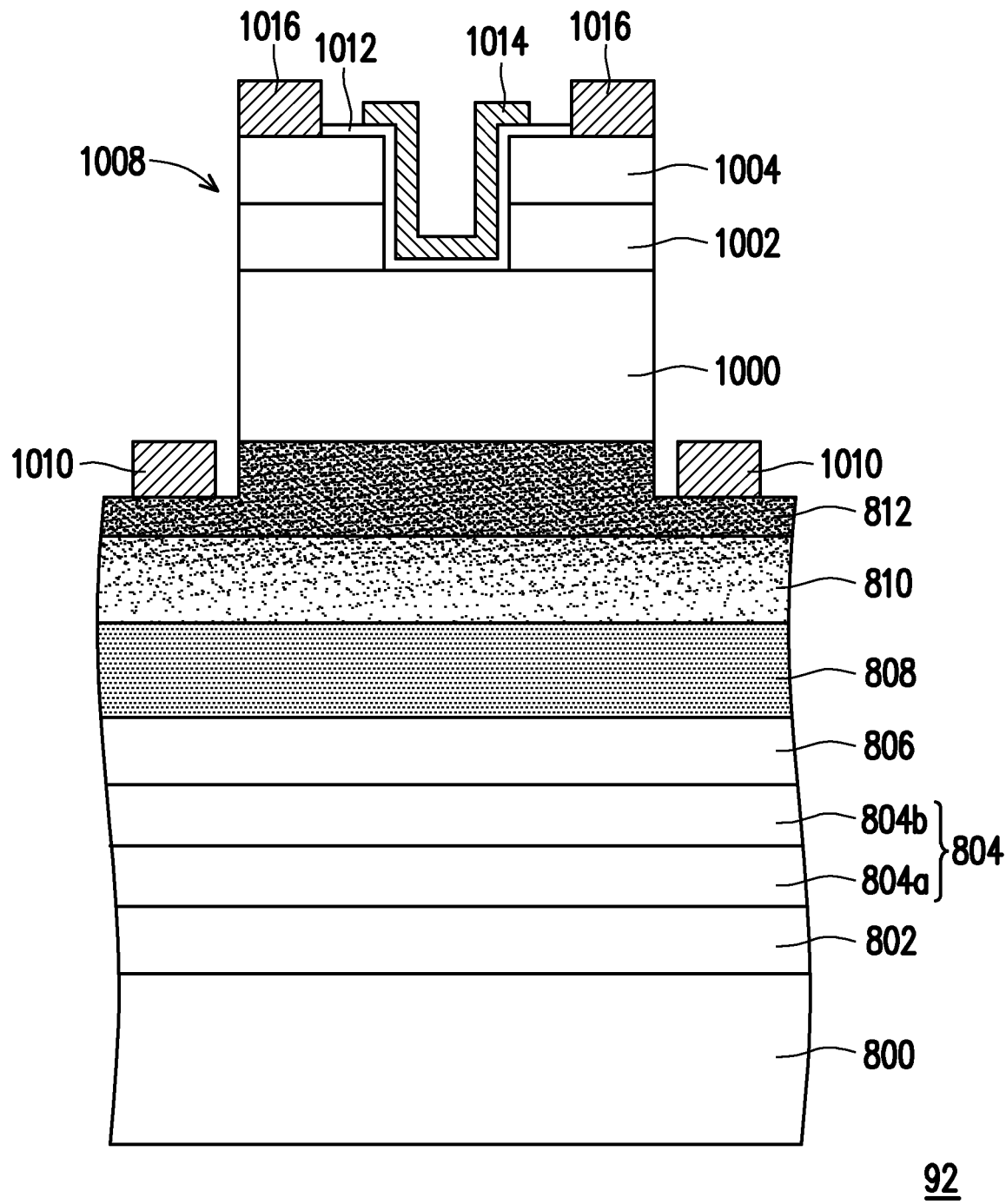

FIGS. 10A to 10B are schematic cross-sectional views of a manufacturing process of an transistor of an embodiment of the present disclosure. In the present embodiment, the same elements as those in FIG. 8D will be denoted by the same reference symbols and will not be described again.

Referring to FIG. 10A, an N-type GaN layer 1000, a P-type GaN layer 1002 and an N-type GaN layer 1004 are sequentially formed on the semiconductor substrate 80. The method for forming the N-type GaN layer 1000, the P-type GaN layer 1002 and the N-type GaN layer 1004 is, for example, an epitaxial growth process. The thickness of the N-type GaN layer 1000 is, for example, between 3 µm and 5 µm. The thickness of the P-type GaN layer 1002 is, for example, between 250 nm and 400 nm. The thickness of the N-type GaN layer 1004 is, for example, between 150 nm and 300 nm. In the present embodiment, the N-type GaN layer 1000, the P-type GaN layer 1002 and the N-type GaN layer 1004 are only exemplary, and are not intended to limit the present disclosure.

Referring to FIG. 10B, the N-type GaN layer 1000, the P-type GaN layer 1002 and the N-type GaN layer 1004 are patterned to form a stacked structure 1008. In the present embodiment, during patterning the N-type GaN layer 1000, the P-type GaN layer 1002 and the N-type GaN layer 1004, a part of the buffer layer 812 is simultaneously removed. Then, sources 1010 are formed on the exposed buffer layer 812. In the present embodiment, the sources 1010 are formed on the buffer layer 812 at both sides of the stacked structure 1008. Then, a recess is formed in the stacked structure 1008, a gate insulating layer 1012 is formed on the surface of the recess, a gate 1014 is formed on the gate insulating layer 1012, and drains 1016 are formed on the N-type GaN layer 1004 at both sides of the gate 1014. In this way, the manufacture of the transistor 92 of the present embodiment is completed. The methods for forming the sources 1010, the gate insulating layer 1012, the gate 1014 and the drains 1016 are well known to those skilled in the art and will not be further described herein.

In the transistor 92, since the ceramic base 800 has balanced stress and may have a lower curvature, each layer formed on the ceramic base 800 may have good quality, and thus the transistor 92 may have better electrical performance.

In particular, the transistor including the semiconductor substrate of the present disclosure is not limited to have a structure like the transistor 70 or the transistor 92. Among other embodiments, transistors may have various well-known structures as long as the semiconductor substrate of the present disclosure is used as the substrate of the transistor.

In addition, the semiconductor substrate of the present disclosure may also be used as the substrate of an LED. When the semiconductor substrate of the present disclosure is used as the substrate of an LED, various configurations of LEDs may be formed on the semiconductor substrate of the present disclosure, which is not limited by the present disclosure.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor substrate with balanced stress, comprising:
   a ceramic base, having an off-cut angle other than 0 degrees;
   a nucleation layer, disposed on the ceramic base; and
   a first buffer layer doped with a first dopant, disposed on the nucleation layer and providing a compressive stress to the ceramic base,
   wherein the first dopant comprises C, Fe or a combination thereof,
   wherein a concentration of the first dopant in the first buffer layer is increased away from the ceramic base, and
   wherein the semiconductor substrate has a curvature between 16 km$^{-1}$ and −16 km$^{-1}$.

2. The semiconductor substrate with balanced stress of claim 1, wherein the ceramic base is a SiC base.

3. The semiconductor substrate with balanced stress of claim 1, wherein the ceramic base has an off-cut angle of 4 degrees.

4. The semiconductor substrate with balanced stress of claim 1, wherein the concentration of the first dopant in the first buffer layer is increased from $5\times10^{16}$ atom/cm$^3$ to $8\times10^{18}$ atom/cm$^3$.

5. The semiconductor substrate with balanced stress of claim 1, further comprising a second buffer layer doped with the first dopant disposed on the first buffer layer, wherein the second buffer layer provides a compressive stress to the ceramic base.

6. The semiconductor substrate with balanced stress of claim 5, wherein the first buffer layer and the second buffer layer each comprise a gallium nitride layer.

7. The semiconductor substrate with balanced stress of claim 6, wherein the concentration of the first dopant in the second buffer layer is not less than $8\times10^{18}$ atom/cm$^3$.

8. The semiconductor substrate with balanced stress of claim 1, wherein a diameter of the ceramic base is between 4 inches and 6 inches.

9. The semiconductor substrate with balanced stress of claim 1, wherein a thickness of the ceramic base is less than 450 μm.

10. A semiconductor substrate with balanced stress, comprising:
    a ceramic base;
    a nucleation layer, disposed on the ceramic base;
    a composite transition layer, comprising a plurality of aluminum-containing layers sequentially stacked on the nucleation layer;
    a first buffer layer doped with a first dopant, disposed on the composite transition layer and providing a compressive stress to the ceramic base; and
    a second buffer layer doped with a second dopant, disposed on the first buffer layer doped with the first dopant and providing a tensile stress to the ceramic base,
    wherein in the composite transition layer, an aluminum content of the aluminum-containing layer relatively away from the ceramic base is higher than an aluminum content of the aluminum-containing layer relatively adjacent to the ceramic base,
    wherein the first dopant comprises C, Fe or a combination thereof,
    wherein the second dopant comprises Si, Ge or a combination thereof,
    wherein a concentration of the second dopant in the second buffer layer is increased away from the ceramic base, and
    wherein the semiconductor substrate has a curvature between −10 km$^{-1}$ and 10 km$^{-1}$.

11. The semiconductor substrate with balanced stress of claim 10, wherein the ceramic base is a QST base.

12. The semiconductor substrate with balanced stress of claim 10, wherein the composite transition layer provides a compressive stress to the ceramic base.

13. The semiconductor substrate with balanced stress of claim 10, wherein a molar ratio of aluminum in each of the aluminum-containing layers is between 0.1 and 0.9.

14. The semiconductor substrate with balanced stress of claim 10, wherein in the composite transition layer, the difference between aluminum molar ratios in the adjacent two aluminum-containing layers is between 0.4/Z and 0.9/Z, and Z represents a number of the aluminum-containing layers in the composite transition layer.

15. The semiconductor substrate with balanced stress of claim 10, wherein the aluminum-containing layer comprises an aluminum gallium nitride layer.

16. The semiconductor substrate with balanced stress of claim 10, wherein a concentration of the first dopant in the first buffer layer is between $5\times10^{17}$ atom/cm$^3$ and $1\times10^{19}$ atom/cm$^3$.

17. The semiconductor substrate with balanced stress of claim 10, wherein the concentration of the second dopant in the second buffer layer is increased from $1\times10^{17}$ atom/cm$^3$ to $1\times10^{19}$ atom/cm$^3$.

18. The semiconductor substrate with balanced stress of claim 10, wherein the first buffer layer and the second buffer layer each comprise a gallium nitride layer.

19. The semiconductor substrate with balanced stress of claim 10, further comprising a third buffer layer doped with the second dopant disposed on the second buffer layer, wherein the third buffer layer provides a tensile stress to the ceramic base.

20. The semiconductor substrate with balanced stress of claim 19, wherein a concentration of the second dopant of the third buffer layer is not lower than $8 \times 10^{18}$ atom/cm$^3$.

* * * * *